US012716132B2

(12) United States Patent
Kuribayashi et al.

(10) Patent No.: US 12,716,132 B2
(45) Date of Patent: Aug. 25, 2026

(54) SUBSTRATE PROCESSING APPARATUS AND SUBSTRATE REMOVAL METHOD

(71) Applicant: Tokyo Electron Limited, Tokyo (JP)

(72) Inventors: Akihiro Kuribayashi, Yamanashi (JP); Kentaro Oshimo, Yamanashi (JP); Hyunyoung Go, Yamanashi (JP); Yudo Sugawara, Iwate (JP); Akashi Fujio, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 570 days.

(21) Appl. No.: 18/067,201

(22) Filed: Dec. 16, 2022

(65) Prior Publication Data

US 2023/0193464 A1 Jun. 22, 2023

(30) Foreign Application Priority Data

Dec. 20, 2021 (JP) ................................ 2021-206424

(51) Int. Cl.
*C23C 16/458* (2006.01)
*H10P 72/76* (2026.01)

(52) U.S. Cl.
CPC ...... *C23C 16/4586* (2013.01); *C23C 16/4584* (2013.01); *H10P 72/7612* (2026.01)

(58) Field of Classification Search
None
See application file for complete search history.

(56) References Cited

U.S. PATENT DOCUMENTS 6,148,762 A * 11/2000 Fukuda ............. H01L 21/68742 414/935
11,145,534 B2 * 10/2021 Lee ................... H01J 37/32724
2010/0187777 A1 * 7/2010 Hao .................. H01L 21/68742 279/142
2011/0313562 A1 * 12/2011 Zhen ................. H01L 21/67745 901/50
2020/0083087 A1 * 3/2020 Ni ..................... H01J 37/32816

FOREIGN PATENT DOCUMENTS

EP 0821404 A2 * 1/1998 ....... H01L 21/68742
JP H07-130825 5/1995
JP 2015-060936 3/2015

* cited by examiner

*Primary Examiner* — David P Turocy
(74) *Attorney, Agent, or Firm* — IPUSA, PLLC

(57) ABSTRACT

A substrate-processing-apparatus includes a processing-vessel to accommodate a substrate and to process the substrate; a substrate-support that is provided inside the processing-vessel and has a mounting-surface on which the substrate is mounted; and a lift-pin-mechanism that includes a lift-pin that is movable relative to the substrate-support and a pin-housing-chamber in which the lift-pin is housed, the lift-pin-mechanism being to lift the substrate by raising the lift-pin, wherein the substrate-support has a hole through which the lift-pin is passable, the lift-pin mechanism includes a pressure-regulator that regulates the pressure in the hole by passing inert-gas through the pin-housing-chamber, and at a timing when the substrate is to be lifted, the pressure-regulator adjusts the pressure in the hole to a lifting pressure that is greater than or equal to the pressure in a processing space that is above the mounting-surface and at which the substrate remains continuously mounted on the mounting-surface.

12 Claims, 10 Drawing Sheets

CONTROLLER
PROCESSOR
MEMORY
90
91
92
15
15a
17
18
20
12
13
$N_2$ GAS
37
27
22
23
28
29
$N_2$ GAS
$N_2$ GAS
19
P
50
50a
61
62
71
70
60
W
S
74
73
75
72
25
26
24
21
13b
42
751
43
16
11
14
13a
41
10
40
1

10
30
FIRST REACTANT GAS
SECOND REACTANT GAS
N2 GAS
N2 GAS
P1
P2
31
32
33
34
35
35
36
36
36
36
12
13a
13a
14
14a
15a
20
26
W

S
10
20
25
60
26
W
24
21
50
651
62
61
63
63a
64
65
13
674
673
671
67
672
71
72
70
SUCTIONING
682
66
681
683
68

S
10
20
25
60
26
W
24
21
50
651
62
61
63
63a
64
65
13
674
673
671
67
672
71
72
70
682
66
681
683
68

S
10
20
62
67
672
671
673
674
61
63
25
651
60
71
72
26
W
64
63a
65
70
24
682
CA
21
50
13
66
681
683
68

S
10
20
62
67
672
671
673
674
61
63
25
651
60
71
72
26
W
64
63a
65
70
24
682
21
50
13
66
681
683
68

RATIO OF PRESSURE IN EACH HOLE TO PRESSURE IN PROCESSING SPACE [TIMES AS LARGE]

SUBSTRATE PROCESSING APPARATUS AND SUBSTRATE REMOVAL METHOD

CROSS-REFERENCE TO RELATED APPLICATIONS

This patent application is based on and claims priority to Japanese Patent Application No. 2021-206424 filed on Dec. 20, 2021, the entire contents of which are incorporated herein by reference.

TECHNICAL FIELD

The present disclosure relates to a substrate processing apparatus and a substrate removal method.

BACKGROUND

A substrate processing apparatus is expected to reduce particle adhesion to the substrate as much as possible. For example, Patent Document 1 discloses a technique that suppresses the generation of particles by moving a substrate diagonally upward to eliminate friction between a wall of a substrate support and the substrate while carrying out the substrate.

Incidentally, in a substrate processing apparatus, particles may get generated by the friction between the substrate and the substrate support even when the substrate is stretched by heating or the like during substrate processing. When removing the substrate, it is imperative to keep particles from adhering to the substrate.

RELATED ART DOCUMENT

Patent Document

Patent Document 1: Japanese Laid-Open Patent Application Publication No. 2015-60936

SUMMARY

According to one aspect of the present disclosure, provided is a substrate processing apparatus that includes:

- a processing vessel configured to accommodate a substrate inside and to process the substrate;
- a substrate support that is provided inside the processing vessel and has a mounting surface on which the substrate is mounted; and
- a lift-pin mechanism that includes both a lift pin that is movable relative to the substrate support and a pin housing chamber in which the lift pin is housed, the lift-pin mechanism being configured to lift the substrate mounted in the substrate support by raising the lift pin,
- wherein the substrate support has a hole through which the lift pin is passable,
- wherein the lift-pin mechanism further includes a pressure regulator that regulates the pressure in the hole by passing inert gas through the pin housing chamber, and
- wherein at a timing when the substrate is to be lifted, the pressure regulator adjusts the pressure in the hole to a lifting pressure that is greater than or equal to the pressure in a processing space that is above the mounting surface, and at which the substrate W remains continuously mounted on the mounting surface.

DETAILED DESCRIPTION OF EMBODIMENTS

Figure 1:
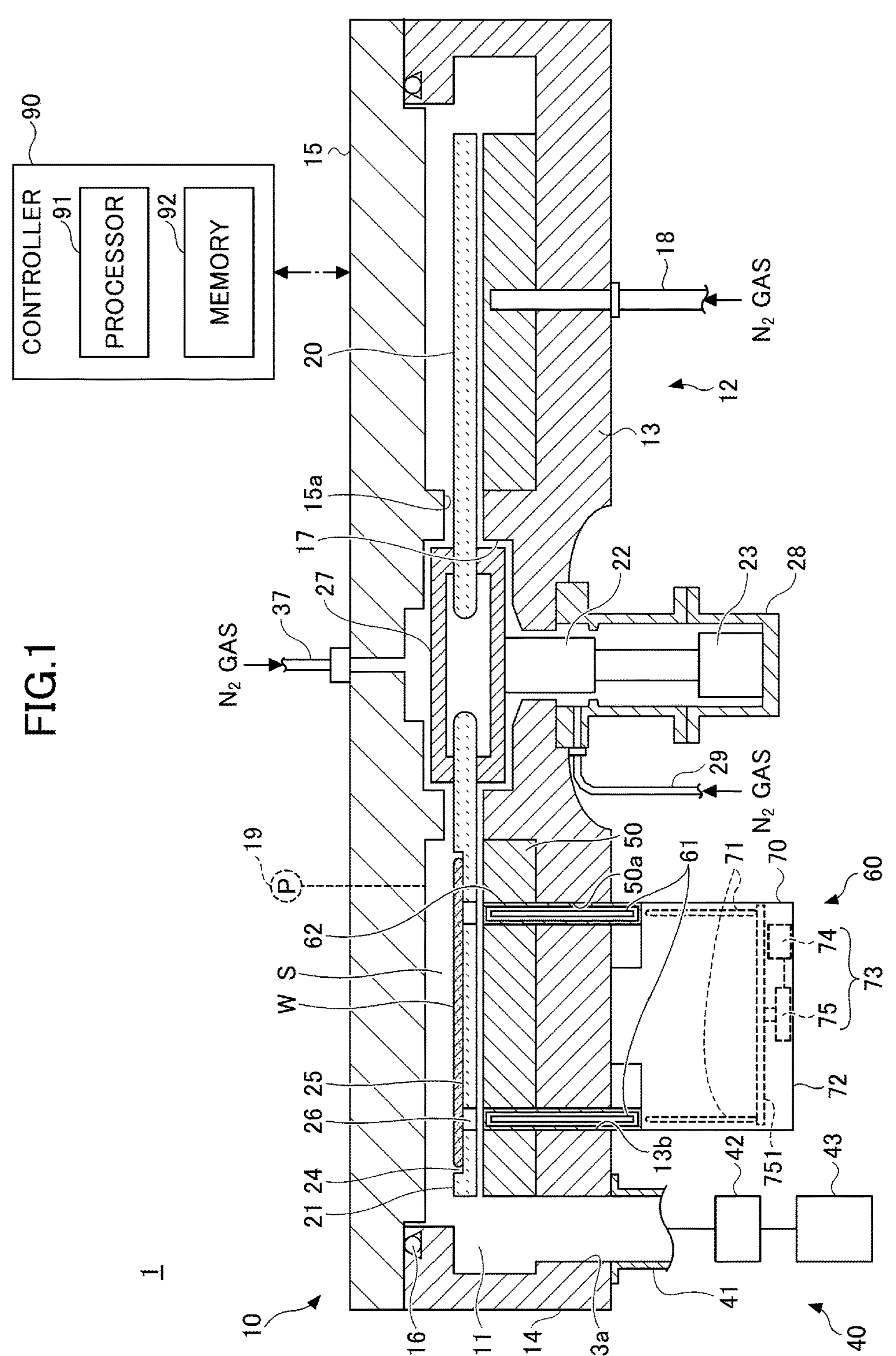
FIG. 1 is a schematic cross-sectional view illustrating a substrate processing apparatus according to an embodiment.

One or more embodiments for implementing the present disclosure is described below with reference to the drawings. In each drawing, the same components are denoted by the same reference numerals, and accordingly, duplicate descriptions may be omitted. In this specification, "to" indicates that the numerical range described before and after the numerical range includes the lower limit value and the upper limit value.

Substrate Processing Apparatus

In the following, as illustrated in FIG. 1, a film deposition apparatus that forms a silicon oxide ($SiO_2$) film on a substrate W by atomic layer deposition (ALD) or molecular layer deposition (MLD) as a substrate processing apparatus 1 is described. The substrate W to be subjected to film deposition processing may be, for example, a semiconductor wafer. A recess pattern of trenches, vias, or the like may be formed on a surface of the substrate W.

The substrate processing apparatus 1 includes a processing vessel 10, a substrate support 20, a gas supply 30, a gas exhaust 40, a heater unit 50, a lift-pin mechanism 60, and a controller 90.

The processing vessel 10 is a vacuum vessel that can depressurize an inner space 11. The processing vessel 10 performs substrate processing such as film deposition processing on the substrate W under a vacuum atmosphere. This processing vessel 10 is formed as a flat cylindrical body having a substantially circular planar shape, and thus this processing vessel 10 can accommodate a plurality of substrates W in a horizontal direction inside the inner space 11. The processing vessel 10 includes a recessed vessel body 12 with the upper side in the vertical direction open and includes a top plate 15 covering the upper part of the vessel body 12. The vessel body 12 and the top plate 15 are preferably formed of, for example, aluminum (Al). The vessel body 12 and the top plate 15 are bonded airtightly by a sealing member 16.

The vessel body 12 has a disk-shaped bottom wall 13 and a side wall 14 protruding from the outer peripheral side of the bottom wall 13 to the upward side in the vertical direction. A transfer port 14*a* for carrying in and carrying out the substrate W is formed on the side wall 14. The transfer port 14*a* is opened and is closed airtightly by a gate valve which is not illustrated. When the gate valve is opened, a substrate-carrying arm CA (see FIG. 3) installed outside the processing vessel 10 enters the processing vessel 10 through the transfer port 14*a* so that the substrate W can be carried in and carried out between the outside of the processing vessel 10 and the inner space 11.

The bottom wall 13 is provided with multiple exhaust ports 13*a* configured to exhaust the gas in the processing vessel 10 to the outside. Multiple lift pins 61 of the lift-pin mechanism 60 to be described and multiple through holes 13*b* through which inert gas is passed are formed in the bottom wall 13.

The substrate support 20 has a rotary table 21 that supports the substrate W in the processing vessel 10; a rotary shaft 22 that is fixed to the center of the rotary table 21; and a rotary drive unit 23 that rotates the rotary shaft 22.

The rotary table 21 is formed of, for example, quartz and is disk-shaped. The center of the rotary table 21 coincides with the axis of the processing vessel 10 and rotates about the axis of the processing vessel 10 under the rotation of the rotary shaft 22.

The top surface of the rotary table 21 has multiple (for example, five) recesses 24 to accommodate and support the substrate W. Each recess 24 is substantially equally spaced apart along the circumferential direction of the rotary table 21. Each recess 24 is circle shaped as viewed in plan view and has an inner diameter slightly larger than (for example, approximately 1 mm to 4 mm greater than the diameter of the substrate W.) the diameter of the substrate W. A substrate W is mounted in each of the multiple recesses 24. The inner space 11 extending from the top surface of the rotary table 21 to the ceiling surface of the top plate 15 serves as a processing space S in which processing is performed on the substrate W.

The bottom surface of the recess 24 serves as a mounting surface 25 on which the substrate W is mounted. The rotary table 21 is provided with multiple (three) holes 26 such that the multiple holes 26 penetrate both the lower surface of the rotary table 21 and the mounting surface 25 of the recess 24. Each lift pin 61 of the lift-pin mechanism 60 passes through a corresponding hole 26. The substrate processing apparatus 1 uses the lift-pin mechanism 60 during the delivering and receiving of the substrate W between each recess 24 and the transfer arm CA while rotation of the rotary table 21 is stopped.

The depth of each recess 24 is set to equal to or greater than the thickness of the substrate W. Therefore, with the substrate W accommodated inside the recess 24, the surface of the substrate W and the top surface of the rotary table 21 are at the same height, or the surface of the substrate W is lower than the top surface of the rotary table 21. The depth of the recess 24 is preferably set to three times the thickness of the substrate W.

The rotary table 21 has a cylindrical core portion 27 at the center of the rotary table 21 and is fixed to the upper end of the rotary shaft 22 via the core portion 27. The rotary shaft 22 penetrates the bottom wall 13 of the processing vessel 10, and the lower end of the rotary shaft 22 is connected to the rotary drive unit 23. The rotary drive unit 23 has a motor and a drive transmitting mechanism (not illustrated), and is accommodated in a case 28 with the upper side in the vertical open. The case 28 is fixed to the bottom wall 13 of the processing vessel 10.

Figure 2:
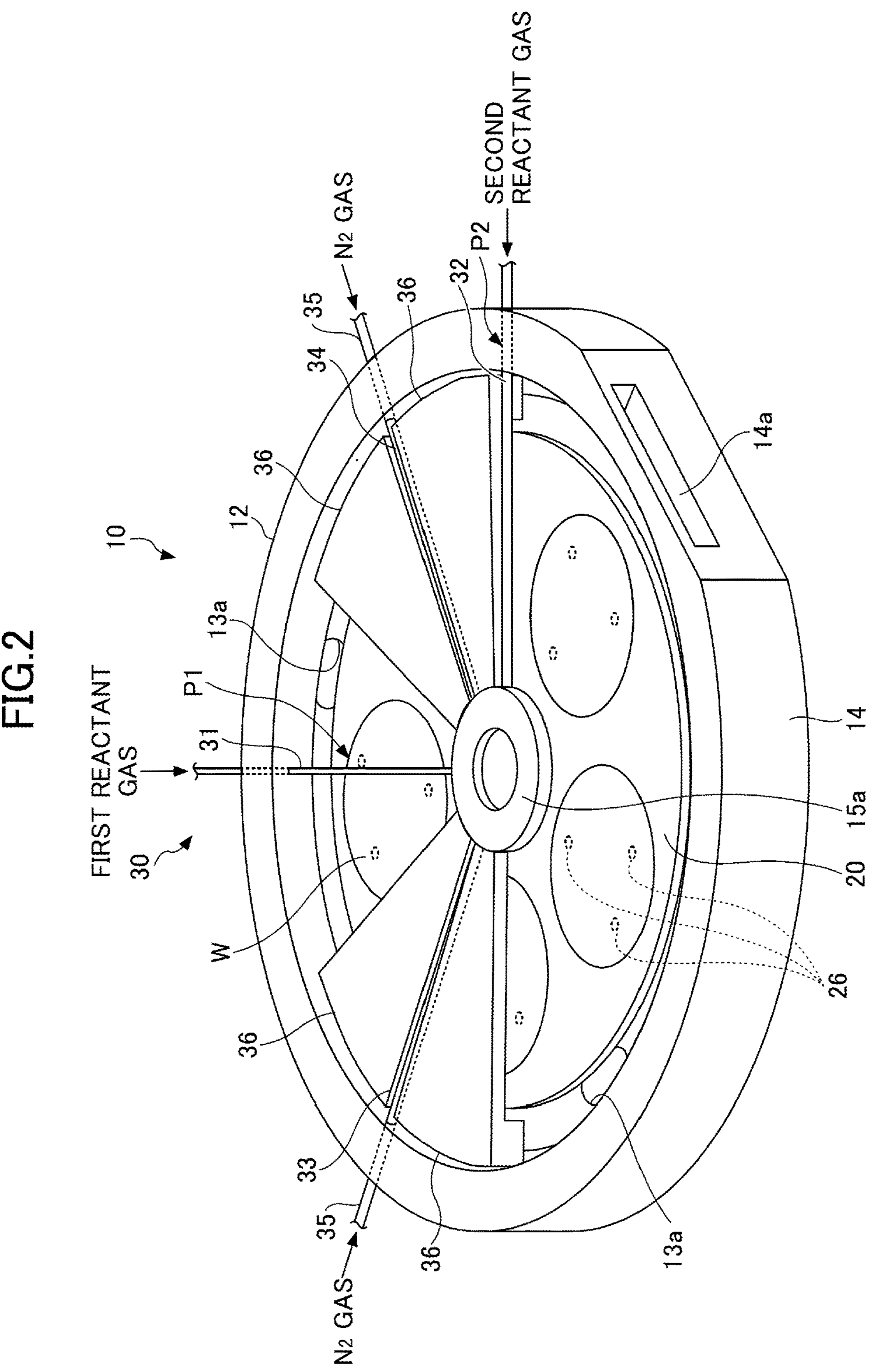
FIG. 2 is a schematic perspective view illustrating an internal structure of the substrate processing apparatus in FIG. 1.
Figure 3:
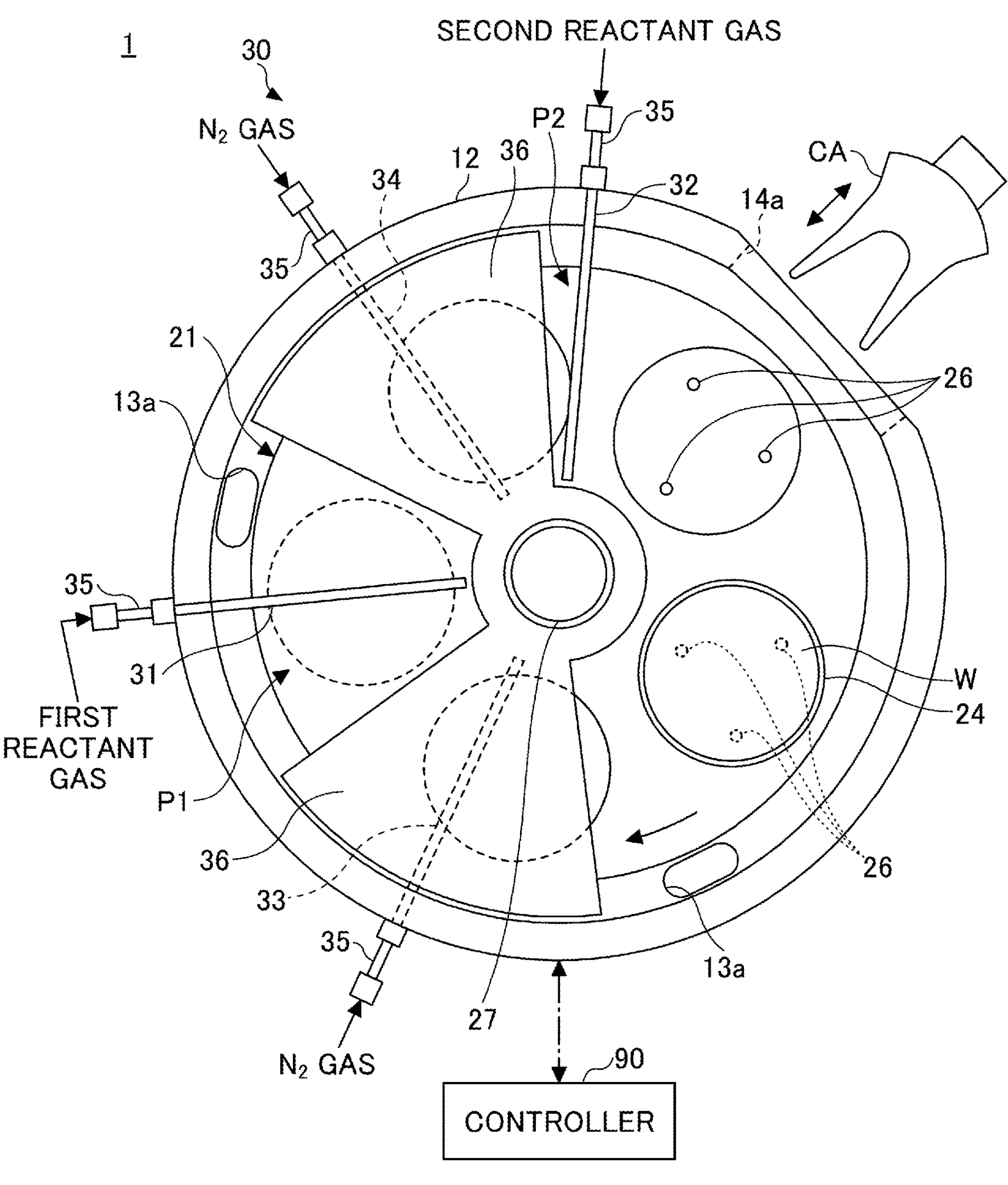
FIG. 3 is a schematic plan view illustrating the internal structure of the substrate processing apparatus in FIG. 1.

As illustrated in FIG. 2 and FIG. 3, in the gas supply 30 of the substrate processing apparatus 1, one or more (two in the present embodiment) reactant gas nozzles 31 and 32 and one or more (two in the present embodiment) separation gas nozzles 33 and 34 are arranged at positions above the rotary table 21. The reactant gas nozzles 31 and 32 and the separation gas nozzles 33 and 34 are formed of quartz, for example, and are spaced apart from each other along the circumferential direction of the processing vessel 10 (the rotational direction of the rotary table 21). In the present embodiment, the separation gas nozzle 33, the reactant gas nozzles 31, the separation gas nozzle 34, and the reactant gas nozzles 32 are arranged clockwise in this order from the transfer port 14*a*.

Each of the reactant gas nozzles 31 and 32 and each of the separation gas nozzles 33 and 34 has a gas inlet port 35 outside the processing vessel 10 for introducing various gases. The gas inlet port 35 is fixed to the side wall 14 of the vessel body 12 and protrudes to the outside of the vessel body 12. Each of the reactant gas nozzles 31 and 32 and each of the separation gas nozzles 33 and 34 is inserted into the processing vessel 10 from the side wall 14 of the vessel body 12 and extends radially inward of the vessel body 12.

Each of the reactant gas nozzles 31 and 32 is connected to a source (not illustrated) of reactant gas via a non-illustrated pipe, a non-illustrated flow rate controller, and so forth. As the reactant gas, silicon-containing gas, metal-containing gas, oxidizing gas, nitriding gas, and the like, can be used. In each of the reactant gas nozzles 31 and 32, multiple discharge holes (not illustrated) opening toward the rotary table 21 are arranged at intervals along the axial direction of each of the reactant gas nozzles 31 and 32. For example, the substrate processing apparatus 1 can be configured to discharge silicon-containing gas or metal-containing gas from the first reactant gas nozzle 31 and to discharge oxidizing gas or nitriding gas from the second reactant gas nozzle 32. In the lower region P1 that is under the first reactant gas nozzle 31, silicon or metal is deposited on the surface of the substrate W, and in the lower region P2 that is under the second reactant gas nozzle 32, the deposited silicon or metal is oxidized or nitrided.

Each of the separation gas nozzles 33 and 34 is connected to a source of separation gas (not illustrated) via a pipe (not illustrated) and a flow rate control valve (not illustrated). As the separation gas, an inert gas such as argon (Ar) gas or nitrogen ($N_2$) gas, for example, can be used. In each of the separation gas nozzles 33 and 34, multiple discharge holes (not illustrated) opening toward the rotary table 21 are arranged at intervals along the axial direction of each of the separation gas nozzles 33 and 34.

As illustrated in FIG. 2 to FIG. 3, two protruding portions 36 are provided in the processing vessel 10. The protruding portions 36 are attached to the rear surface of the top plate 15 to project toward the rotary table 21, so that the protruding portions 36 form separation regions together with the separation gas nozzles 33 and 34. Further, the protruding portions 36 each have a circular sector planar shape whose the top portion is cut in an arc shape so that the inner arc is connected to the protrusion 15*a* of the top plate 15 and an outer arc is disposed along the inner peripheral surface of the side wall 14 of the vessel body 12.

The inert gas discharged from each of the separation gas nozzles 33 and 34 acts as a counterflow to the first reactant gas in the lower region P1 and to the second reactant gas in the lower region P2 by inducing a flow in accordance with the protruding portion 36. Therefore, the first reactant gas in the lower region P1 is separated from the second reactant gas in the lower region P2. This substantially prevents the first reactant gas and the second reactant gas from mixing and reacting in the inner space 11 of the processing vessel 10.

Further, as illustrated in FIG. 1, the substrate processing apparatus 1 connects a separation gas supply pipe 37 to the center of the top plate 15 of the processing vessel 10, and supplies separation gas to the space between the top plate 15 and the core portion 27. The separation gas substantially prevents the mixing of the first reactant gas supplied to the lower region P1 and the second reactant gas supplied to the lower region P2 through the center.

An exhaust pipe 41 that is the gas exhaust 40 is connected to multiple exhaust ports 13*a* provided on the bottom wall 13. The exhaust pipe 41 is provided with a pressure controller 42 and a vacuum pump 43.

The heater unit 50 is provided on the upper surface of the bottom wall 13. The heater unit 50 has a housing 51 (see FIG. 4) protruding from the bottom wall 13 and in close proximity to the lower surface of the rotary table 21, and has electric heating wiring 52 (see FIG. 4) contained in the housing 51. The heater unit 50 heats the substrate W mounted on the rotary table 21 to the temperature set in the recipe. In the heater unit 50, multiple through holes 50*a* through which the lift pins 61 are passed are formed at the same positions where each through hole 13*b* of the bottom wall 13 is formed.

The bottom wall 13 that is closer to the center of rotation than the space, where the heater unit 50 is located, is to the center of rotation, forms a protrusion 17 projecting upward so as to approach the core portion 27. The space between the protrusion 17 and the core portion 27 and the clearance between the inner peripheral surface of the hole of the rotary shaft 22 penetrating the bottom wall 13 and the rotary shaft 22 are both narrow, and these narrow spaces communicate with the case 28. The case 28 is provided with a purge gas supply pipe 29 that supplies nitrogen gas, which is a purge gas.

On the bottom wall 13 of the processing vessel 10 below the heater unit 50, a plurality of purge gas supply pipes 18 are provided at predetermined intervals along the circumferential direction of the processing vessel 10. The supply of purge gas by each purge gas supply pipe 18 purges gas in the space where the heater unit 50 is provided.

The controller 90 of the substrate processing apparatus 1 provides instructions to each of the components of the substrate processing apparatus 1 regarding operation and controls the operation of each component. The controller 90 is computer for performing control and has one or more processors 91, a memory 92, an input-and-output interface, and an electronic circuit that are not illustrated. Each of the one or more processors 91 includes a combination of one or more among a central processing unit (CPU), a graphic processing unit (GPU), an application specific integrated circuit (ASIC), a field programmable gate array (FPGA), and a circuit constituted by discrete semiconductors. The memory 92 includes a nonvolatile memory and a volatile memory and forms the storage part of the controller 90. The nonvolatile memory may be, for example, a flexible disk, a compact disc, a hard disk, a flash memory, a DVD, or the like.

Lift-Pin Mechanism 60

Next, the lift-pin mechanism 60 of the substrate processing apparatus 1 is described. When carrying the substrate W into and out of the substrate support 20 by the carrying arm CA (see FIG. 3), the lift-pin mechanism 60 moves the multiple (three in the present embodiment) lift pins 61 up and down to perform delivering and receiving of the substrate W to and from the carrying arm CA. In FIG. 1, two lift pins 61 are illustrated for illustrative convenience. The number of lift pins 61 of the lift-pin mechanism 60 is not particularly limited. The lift-pin mechanism 60 may include, for example, four or more lift pins 61.

The substrate processing apparatus 1 is equipped with the lift-pin mechanism 60 in a position facing the rotary table 21 near the transfer port 14*a*, and mounts the substrates W with respect to the respective multiple recesses 24 that move with the rotation of the rotary table 21, and also lifts the substrates W from the respective recesses 24. The lift-pin mechanism 60 is fixed to the bottom wall 13 at a position where the lift-pin mechanism 60 can face each recess 24 as the rotary table 21 rotates. The lift-pin mechanism 60 includes three (multiple) upper lifting portions 62 each having three lift pins 61 and includes one lower operating portion 70 that raises and lowers the three lift pins 61.

Figure 4:
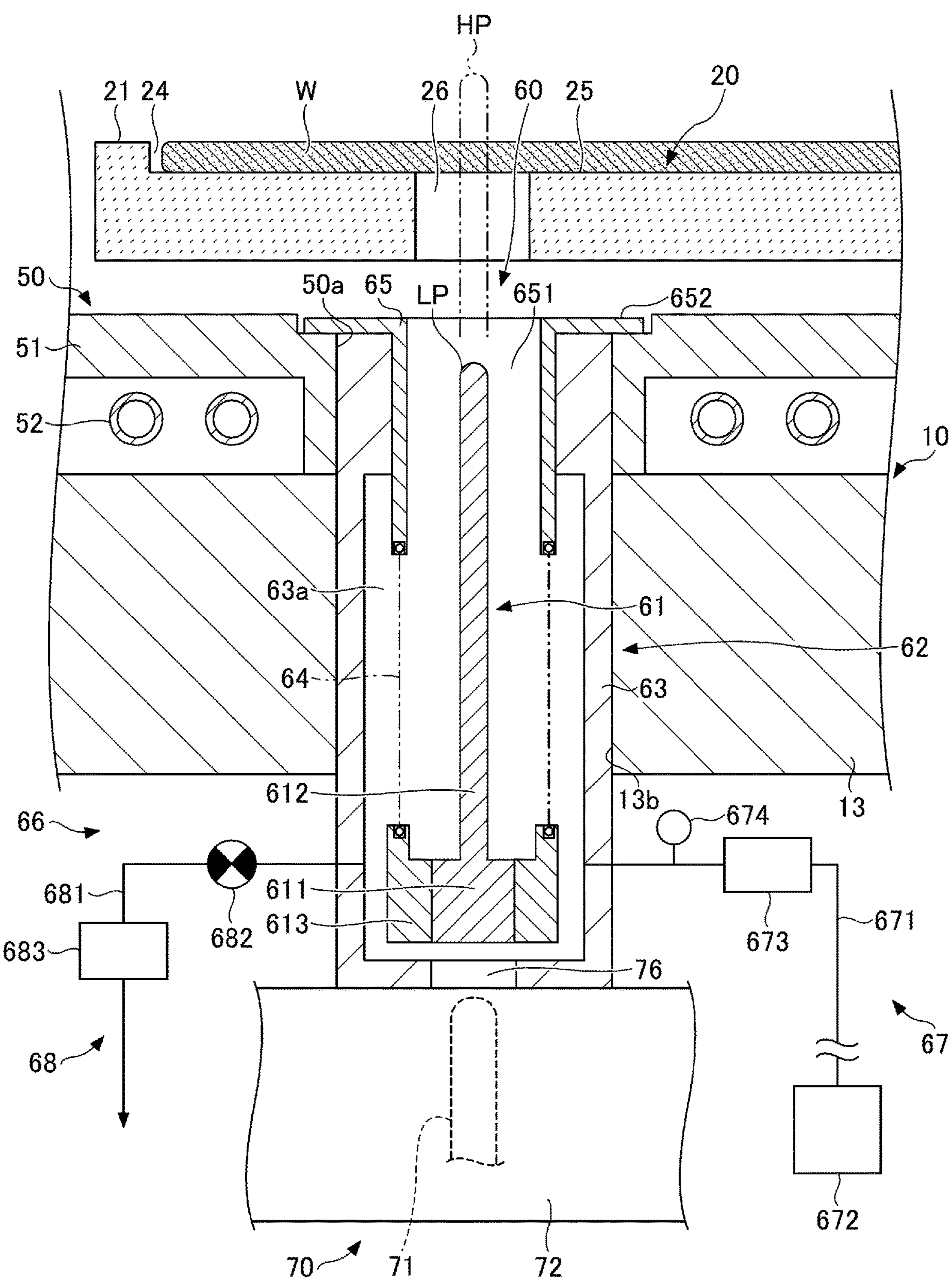
FIG. 4 is a schematic cross-sectional view illustrating a lift-pin mechanism of the substrate processing apparatus of FIG. 1.

As illustrated in FIG. 4, each upper lifting portion 62 is installed over the through hole 13*b* in the bottom wall 13 of the processing vessel 10 and the through hole 50*a* in the housing 51 of the heater unit 50. Each upper lifting portion 62 includes an upper case 63, a lift pin 61, a spring member 64, a cylindrical member 65, and a pressure regulator 66.

The upper case 63 is formed in a cylindrical shape such that the upper case 63 can be accommodated in the through hole 13*b* of the bottom wall 13 and the through hole 13*b* of the heater unit 50, and is firmly fixed to the bottom wall 13 and the heater unit 50 by suitable fixing means. The inside of the upper case 63 is a pin housing chamber 63*a* in which the lift pin 61 and the cylindrical member 65 can be freely raised and lowered. The upper case 63 is situated apart from and radially outward relative to the lift pin 61 housed in the pin housing chamber 63*a* and does not contact with the lift pin 61 when the lift pin 61 is raised and lowered.

In addition, the upper case 63 protrudes in the downward vertical direction more than the lower surface of the bottom wall 13 in the mounted state. The lift-pin mechanism 60 connects the pressure regulator 66 to the protruding part of the upper case 63.

The lift pin 61 is a cylindrical (a solid rod-shape) member and is formed longer than the combined thickness of the bottom wall 13 and the heater unit 50. The lift pin 61 displaces between a lowered position LP and a raised position HP (long dashed double-short dashed line in FIG. 4). The lowered position LP is a position where an upper end of the lift pin 61 is situated below the upper surface of the heater unit 50, whereas the raised position HP is a position where the upper end of the lift pin 61 protrudes beyond the upper surface of the rotary table 21.

The lift pin 61 has a lower end base 611 having a cylindrical shape that is large in diameter; and has a rod part 612 having a cylindrical shape and projecting from the lower end base 611 in the upward vertical direction and having a smaller diameter than that of the lower end base 611. The lower end base 611 and the rod part 612 are integrally formed together. The material that makes up the lift pin 61 is preferably a metal material or a ceramic having high abrasion resistance, and in the present embodiment, alumina ($Al_2O_3$) is applied.

The lower end base 611 is a receiving part that receives a pressing force from a plunger 71 of the lower operating portion 70, which is described later. A seat member 613 configured to fix a lower end of the spring member 64 is fixed to the outer peripheral surface of the lower end base 611. The rod part 612 has a smooth outer peripheral surface having a constant outer diameter, and extends along the axis of the upper case 63. The upper end of the rod part 612 contacts and supports the substrate W, when the upper end projects from the rotary table 21. The upper end of the rod part 612 is formed in a substantially hemispherical shape and can make point contact with the substrate W.

The lift pin 61 is positioned at the lowered position LP below the upper surface of the heater unit 50 to enable the rotary table 21 to rotate. With the rotary table 21 is in a rotation-stopped state, the lift pin 61 faces the hole 26 formed in the recess 24 of the rotary table 21. By being pushed and, in turn, raised by the plunger 71 of the lower operating portion 70, the lift pin 61 passes through a corresponding hole 26 of the rotary table 21 and is exposed above the upper surface of the rotary table 21.

The spring member 64 is situated peripheral to the rod part 612 of the lift pin 61 in a non-contact manner, and a coil spring capable of expanding and contracting in the vertical direction is applied. The lower end of the spring member 64 is fixed to the upper end of the seat member 613 as described above. The upper end of the spring member 64 is fixed to the cylindrical member 65.

The cylindrical member 65 is situated on the upper end side of the upper case 63. The cylindrical member 65 is formed in a cylindrical shape such that the cylindrical member 65 can be accommodated inside the through hole 13*b* of the heater unit 50, and has a cylindrical hole 651 inside where the rod part 612 of the lift pin 61 is situated. The lower end of the cylindrical member 65 serves as a spring seat that can accommodate the upper end of the spring member 64. The upper end of the cylindrical member 65 is provided with a flange 652 formed in a ring shape and protrudes radially outward from the cylindrical portion thereof. The flange 652 is configured to catch on the top surface of the housing 51 of the heater unit 50. When the flange 652 is caught by the heater unit 50, the lift pin 61 can be supported via the cylindrical member 65 and the spring member 64, and thus the lift pin 61 does not contact with the bottom surface of the upper case 63.

This cylindrical member 65 is movable relative to the upper case 63. When the lift pin 61 is raised, the cylindrical member 65 is pushed upward through the spring member 64 and is thus raised together with the lift pin 61. The flange 652 of the cylindrical member 65 comes into contact with the lower surface of the rotary table 21 as the lift pin 61 is raised, thereby causing the hole 26 of the rotary table 21 to communicate with the pin housing chamber 63*a* of the upper case 63 through a cylindrical hole 651. Upon the cylindrical member 65 contacting the rotary table 21, the raising of the cylindrical member 65 stops, yet the lift pin 61 continues to be raised relative to the cylindrical member 65. Accordingly, the lift-pin mechanism 60 can stably insert the lift pin 61 into the hole 26 of the rotary table 21.

The pressure regulator 66 of the lift-pin mechanism 60 includes both a gas supply 67 that supplies gas to the pin housing chamber 63*a* of the upper case 63 and a gas exhaust 68 that exhausts gas out from the pin housing chamber 63*a*. The pressure regulator 66 regulates entry of processing gas into the components (the heater unit 50, the lift-pin mechanism 60, and so on) below the rotary table 21 by the flow of gas. Examples of gas supplied by the gas supply 67 include inert gas such as argon gas, nitrogen gas, and dry air.

Specifically, the gas supply 67 includes a gas supply channel 671 connected to the upper case 63 protruding from the bottom wall 13. The gas supply 67 also has a gas source 672, a mass flow controller 673, a pressure sensor 674, an opening-and-closing valve (not illustrated), and so on, in this order from the upstream side to the downstream side of the gas supply channel 671. The gas supply 67, under the control of the controller 90, opens and closes the opening-and-closing valve and, with the opening-and-closing valve open, regulates the flow rate of the inert gas supplied from the gas source 672 by the mass flow controller 673 thereby supplying an appropriate amount of the inert gas into the upper case 63. The pressure sensor 674 detects the pressure of the inert gas flowing through the gas supply channel 671 and transmits the pressure value to the controller 90. This pressure value indirectly represents the pressure in the pin housing chamber 63*a*.

In contrast to the above, the gas exhaust 68 of the lift-pin mechanism 60 regulates the pressure in the upper case 63 by exhausting the gas from the inside of the upper case 63. This gas exhaust 68 has a gas exhaust channel 681 connected a protruding part of the upper case 63 and also has a flow rate regulator valve 682 and a pump 683 at positions partway along the gas exhaust channel 681. The gas exhaust 68 performs suction inside the upper case 63 by operation of the pump 683 under the control of the controller 90. The flow rate regulator valve 682 adjusts the flow rate, thereby enabling the gas exhaust 68 to control the pressure in the pin housing chamber 63*a*.

As illustrated in FIG. 1, the lower operating portion 70 of the lift-pin mechanism 60 is provided on the lower side of three upper lifting portions 62. The lower operating portion 70 has three plungers 71 corresponding to the three lift pins 61 of the lift-pin mechanism 60, and each plunger 71 is displaced in the vertical direction thereby pressing the lower end base 611 of each lift pin 61 respectively during the raising of the lift pins 61. In other words, the lift-pin mechanism 60 has a two-stage structure in which: the multiple lift pins 61 in direct contact with the substrate W; and multiple plungers 71 configured to raise and lower each lift pin 61, are separately provided. The lift-pin mechanism 60 may have a drive unit (not illustrated) connected to each lift pin 61 without having any of the plungers 71, and each lift pin 61 may be directly raised and lowered by the drive unit.

A lower operating portion 70 includes both a lower case 72 that can accommodate three plungers 71 and a plunger driving unit 73 that integrally operates the three plungers 71. The lower case 72 is formed in an appropriate shape (substantially disk-shaped) to accommodate each component of the lower operating portion 70, and is fixed to the lower end of the upper case 63. The upper case 63 and the lower case 72 are airtightly fixed together by sealing members not illustrated.

The plunger driving unit 73 includes a drive source 74 and a drive transmitting unit 75 that transmits the driving force of the drive source 74 to the plunger 71. The drive source 74 operates based on the control by the controller 90 and outputs the driving force to the drive transmitting unit 75. The type of drive source 74 is not particularly limited and, for example, a motor, a hydraulic or pneumatic cylinder mechanism, a magnetic mechanism, or the like may be applied to the drive source 74. The drive transmitting unit 75 raises and lowers, in the vertical direction, a movable body 751 supporting the three plungers 71 by slowing down or converting the driving force of the drive source 74 as appropriate.

As illustrated in FIG. 4, each plunger 71 is formed in an elongated solid rod shape, and extends parallel to the vertical direction by being fixed to the movable body 751. Passages 76 through which the plungers 71 are passed are formed at positions facing the plungers 71 in the upper case 63 and the lower case 72. Then, when the substrate W is to be received or passed, the plunger 71 is raised together with the movable body 751 and is moved within the pin housing chamber 63*a* of the upper case 63. Each plunger 71 pushes up the corresponding lift pin 61 by contacting the lower end base 611 of the corresponding lift pin 61.

Operation of Substrate Processing Apparatus 1

The substrate processing apparatus 1 according to the present embodiment is basically configured as described above. The operation the substrate processing apparatus 1 is described below.

As illustrated in FIG. 1 to FIG. 4, the controller 90 of the substrate processing apparatus 1 opens the gate valve to carry the substrate W into the processing vessel 10 in preparation for film deposition processing. The substrate W is held by the conveyance arm CA and conveyed into the processing vessel 10, and is placed directly over the recess 24 to be placed on the rotary table 21. In this state, the controller 90 operates the lift-pin mechanism 60 facing the substrate W to receive the substrate W from the transfer arm CA. At this time, the lift-pin mechanism 60 simultaneously pushes up each of the plungers 71 of the lower operating portion 70 so that the upper end of each plunger 71, and thus the upper end of each plunger 71 presses each lower end base 611 thereby raising each lift pin 61. Each of the lift pins 61 receives the substrate W by being raised to the standby position (raised position HP) of the substrate W and contacting the lower surface of the substrate W. At this time, the lift-pin mechanism 60 may supply inert gas to the pin housing chamber 63*a* via the gas supply 67. This substantially prevents residual reactant gas from the preceding film deposition processing from entering the underside of the rotary table 21.

After each of the lift pins 61 receives the substrate W, the controller 90 causes the transfer arm CA to withdraw from the processing vessel 10 and operates the lift-pin mechanism 60 to lower each lift pin 61, thereby placing the substrate W in the recess 24 of the rotary table 21. The substrate processing apparatus 1 arranges the substrates W in all the recesses 24 by performing the above operation for each of the multiple recesses 24.

After housing the substrates W in the recess 24 of the rotary table 21, the substrate processing apparatus 1 starts film deposition processing. For example, the controller 90 discharges the first reactant gas from the first reactant gas nozzle 31 to the lower region P1 and discharges the second reactant gas from the second reactant gas nozzle 32 to the lower region P2 in a state where the separation gas is discharged from the separation gas nozzles 33 and 34 into the processing vessel 10. Further, the controller 90 rotates the rotary table 21 at a predetermined speed by the rotary drive unit 23 when the reactant gas and the separated gas are discharged. Thus, as the substrates W mounted on the rotary table 21 repeatedly pass through the lower region P1 and the lower region P2, the ALD film is deposited on the surface of the substrates W.

In addition, the controller 90 heats the substrates W of the rotary table 21 by operating the heater unit 50 during film deposition processing. The controller 90 may operate the gas supply 67 of the lift-pin mechanism 60 to supply inert gas to the upper case 63 of the upper lifting portions 62 during film deposition processing. The inert gas supplied to the pin housing chamber 63*a* flows out to the underside of the rotary table 21 in the processing vessel 10, and thus the reactant gas can be substantially prevented from entering the underside of the rotary table 21. Further, after film deposition processing, the substrate processing apparatus 1 supplies purge gas into the processing vessel 10 via purge gas supply pipes 18 and 29 to guide the gas in the processing vessel 10 to the exhaust port 13*a* (gas exhaust 40).

After the above processing, the controller 90 performs an operation (hereinafter, referred to as the substrate removal method) of raising the substrate W housed in each recess 24 of the rotary table 21 from the mounting surface 25 to the raised position HP and passing the respective substrates W to the transfer arm CA that has entered the processing vessel 10. As mentioned above, in the film deposition processing, particles may remain in the processing vessel 10 due to rubbing between the substrate W and the rotary table 21 due to stretching of the substrate W by heating or the like. If particles of this type fly up when the substrate W is taken out, they adversely adhere to the peripheral edge of the substrate W. In the substrate removal method, the substrate processing apparatus 1 according to the present disclosure performs processing to regulate the pressure on the lower surface side of the substrate W (each hole 26) to a lifting pressure that is slightly higher than that of the processing space S on the upper side of the substrate W in order to substantially prevent adhesion of particles generated during the film deposition processing to the substrate W.

Figure 5:
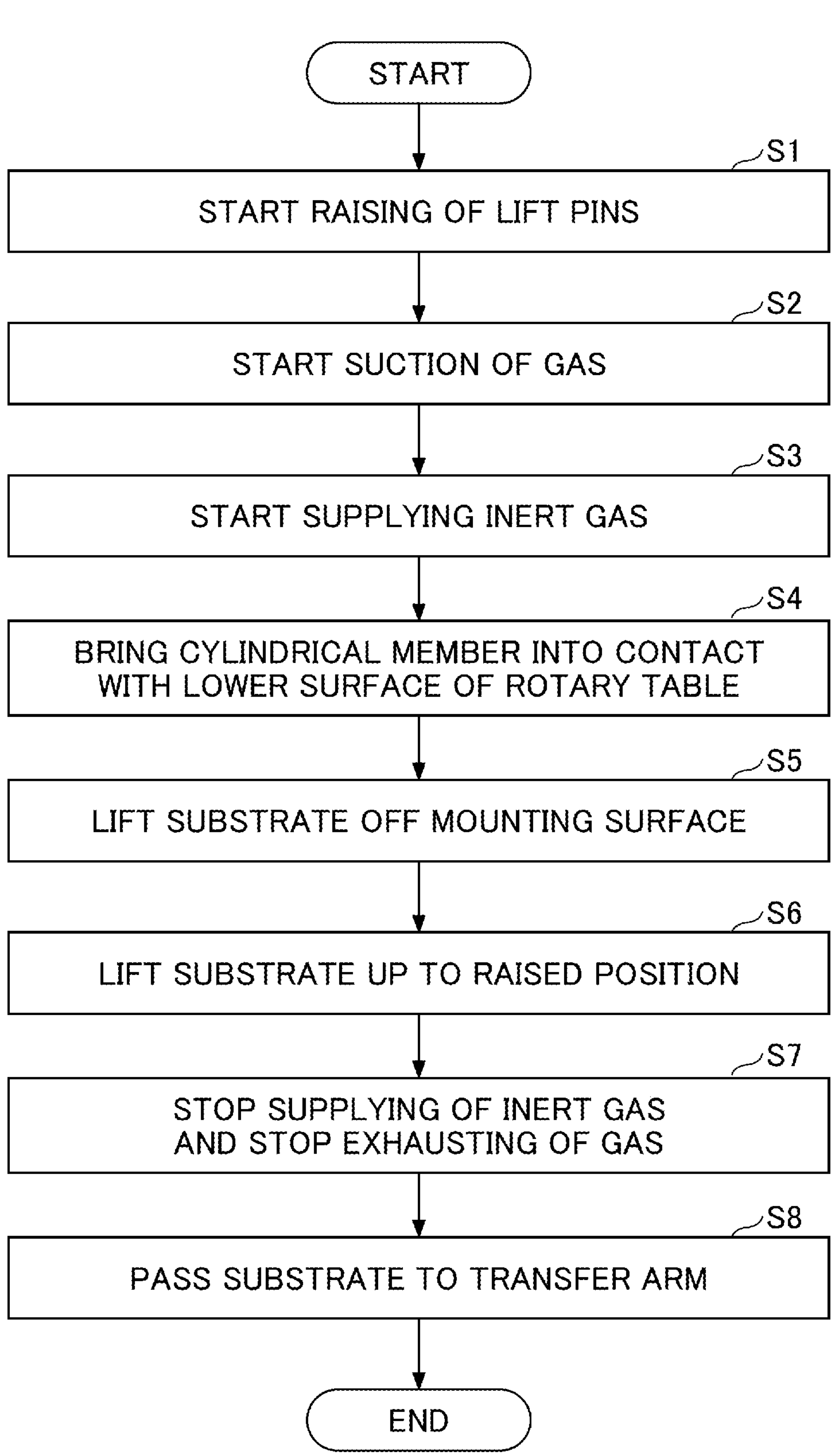
FIG. 5 is a flowchart illustrating a processing flow of a substrate removal method.
Figure 6B:
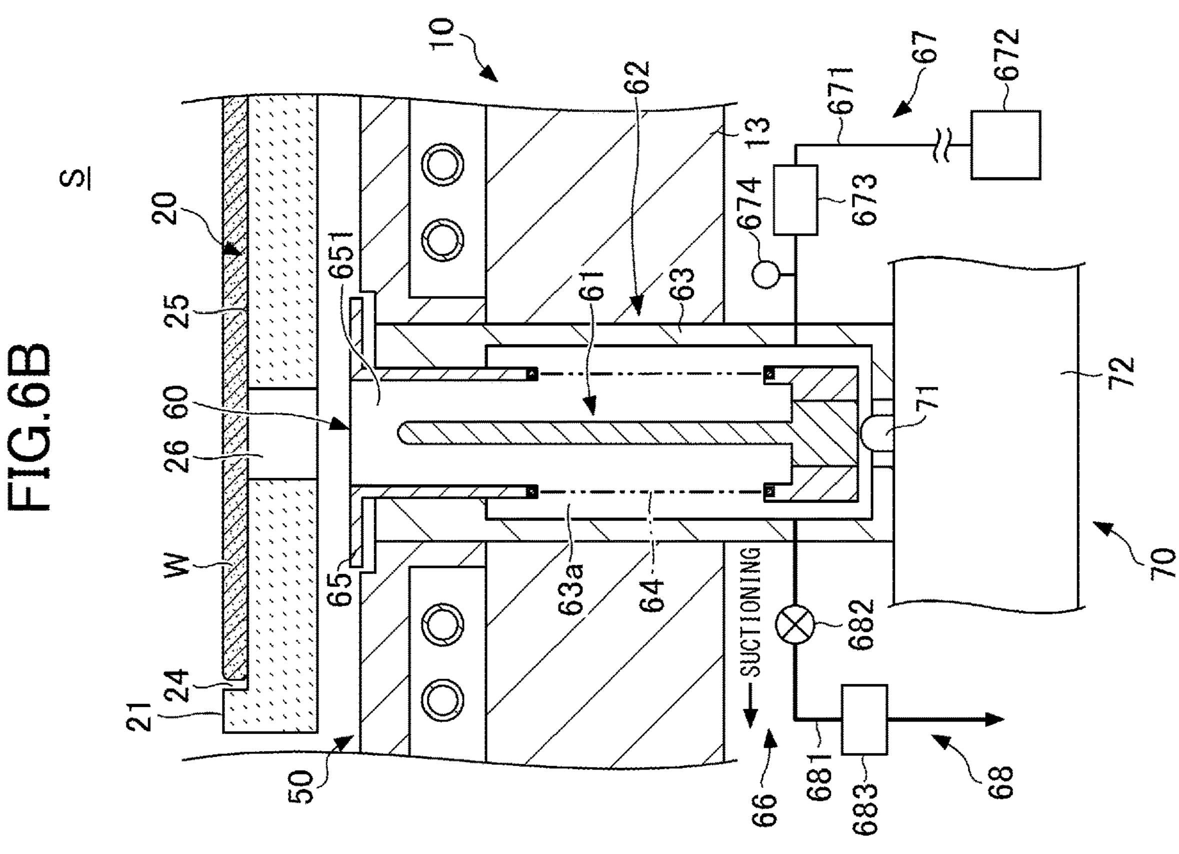
FIG. 6A to FIG. 6C are schematic cross-sectional views illustrating an operation of the lift-pin mechanism, with FIG. 6A illustrating a first state, FIG. 6B illustrating a second state, and FIG. 6C illustrating a third state.
Figure 6A:
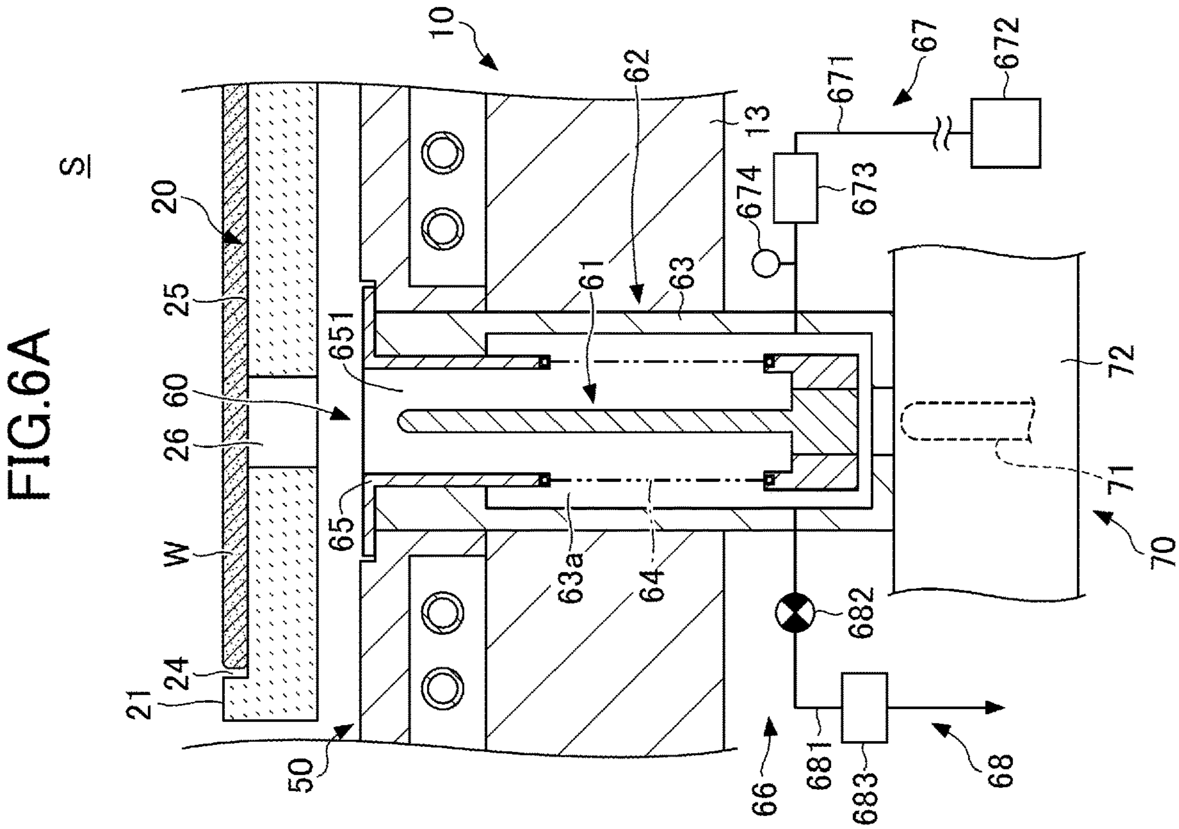

Specifically, in the processing flow of the substrate removal method illustrated in FIG. 5, the controller 90 first operates the lower operating portion 70 to start raising the lift pins 61 (step S1). As illustrated in FIG. 6A, the lift pin 61 is positioned in the lowered position LP until the lift pin 61 receives a pressing force from the plunger 71. The lower operating portion 70 raises each plunger 71 under the control of the controller 90 to push each plunger 71 against each lift pin 61. Thereafter, the lower operating portion 70 raises each lift pin 61 at the same time by continuously raising each plunger 71.

When the lift pins 61 rise, the controller 90 operates the gas exhaust 68 to start sucking gas out of the pin housing chamber 63*a* of the upper case 63 (step S2 in FIG. 5). As illustrated in FIG. 6B, the position where the lift pin 61 and the cylindrical member 65 are displaced slightly upward from the lowered position LP is the timing to start sucking gas out of the pin housing chamber 63*a*. By sucking out the gas in the pin housing chamber 63*a*, the pressure below the rotary table 21 can be reduced. The timing to start sucking gas out of the pin housing chamber 63*a* may be the time at which the plunger 71 begins rising or may be a time prior to the raising of the plungers 71.

The start timing of suction out the pin housing chamber 63*a* can be controlled by the movement distance of the plunger 71 (as can the operation timing in step S2 and beyond). As an example, the controller 90 measures the number of revolutions of the drive source 74 with an encoder (not illustrated), recognizes the position of the plunger 71 based on the measured value of the encoder, and starts sucking out gas at the arrival timing of a predetermined position. For example, control may be performed by measuring the time from the start of operation of the plunger 71. As an example, the controller 90 starts suction of gas after a predetermined time has elapsed from the start of operation of the plunger 71. Alternatively, the substrate processing apparatus 1 may be equipped with a sensor (not illustrated) that detects the position of the plunger 71 or the position of the lift pin 61 and determines the operation timing based on the detected position of the sensor.

Figure 6C:
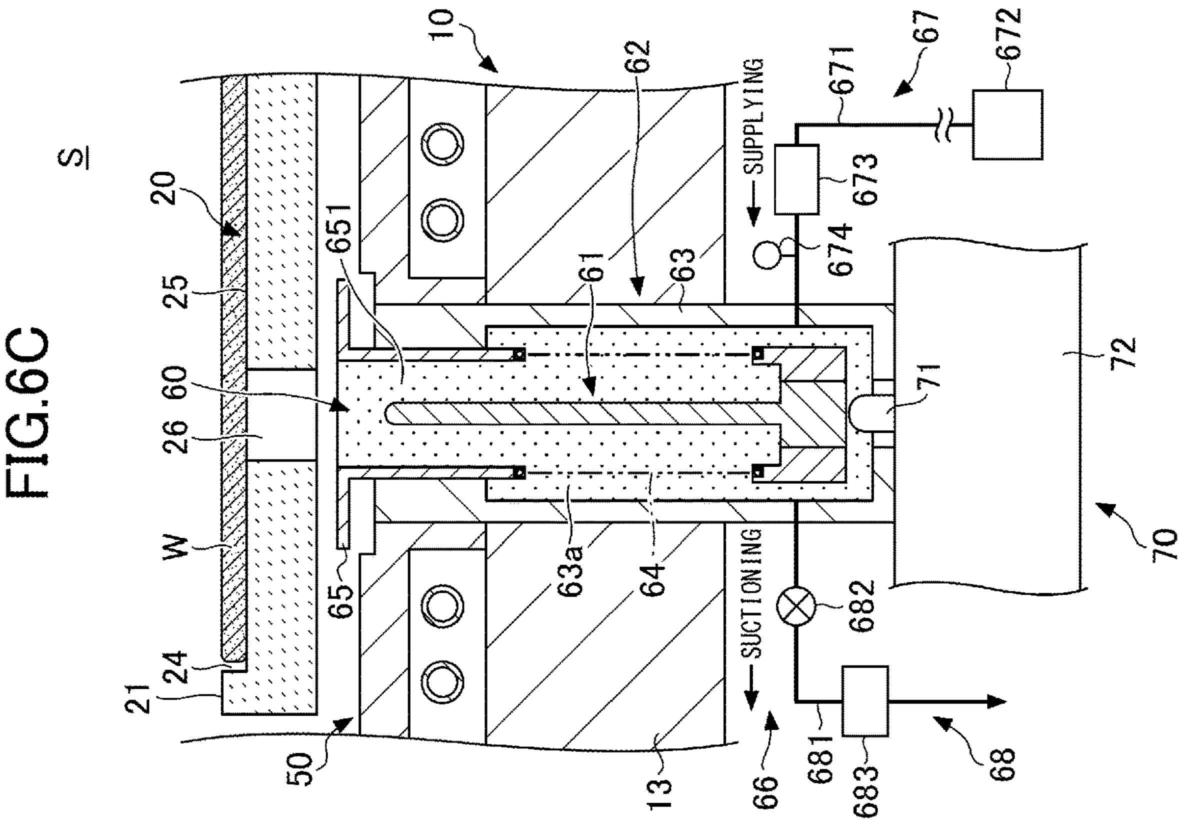

After the start of suction of the pin housing chamber 63*a*, the controller 90 operates the gas supply 67 to start supplying inert gas to the pin housing chamber 63*a* of the upper case 63 (step S3 in FIG. 5). As illustrated in FIG. 6C, the gas supply 67 opens an opening/closing valve (not illustrated)

and regulates the flow rate of the inert gas by a mass flow controller 673 to supply the inert gas to the pin housing chamber 63*a* at an appropriate flow rate.

Figure 7A:
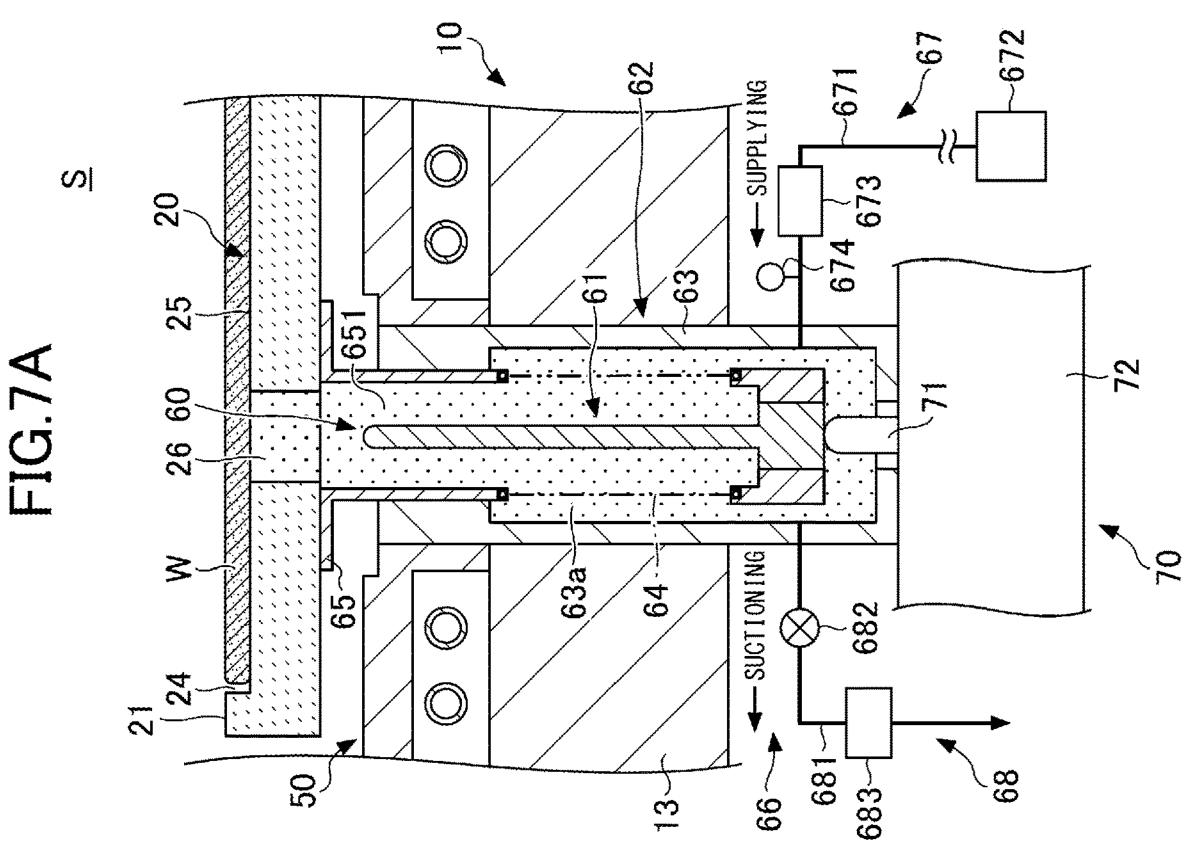
FIG. 7A to FIG. 7C are schematic cross-sectional views illustrating the operation of the lift-pin mechanism following FIG. 6, with FIG. 7A illustrating a fourth state, FIG. 7B illustrating a fifth state, and FIG. 7C illustrating a sixth state.

It is sufficient if the start timing of the supply of the inert gas is set to a timing before the cylindrical member 65 comes into contact with the lower surface of the rotary table 21. When the cylindrical member 65 comes into contact with the lower surface of the rotary table 21, as illustrated in FIG. 7A, the pin housing chamber 63*a* of the upper case 63, the cylindrical hole 651 of the cylindrical member 65, and the hole 26 of the rotary table 21 communicate with one another, and a space is formed in which the upper portion of the space is blocked by the substrate W. By supplying inert gas to stabilize the gas supply before this space is formed, the supply pressure of the gas is suddenly applied to the substrate W, and thus the substrate W can be substantially prevented from rising from the mounting surface 25.

After supplying the inert gas, the cylindrical member 65 comes into contact with the lower surface of the rotary table 21 as the lift pin 61 is raised (step S4 in FIG. 5). This temporarily blocks the space. However, based on the pressure value detected by the pressure sensor 674 in the supply of the inert gas, the controller 90 regulates the supply amount of the inert gas by the mass flow controller 673 and regulates the exhaust amount of the gas by the flow rate regulator valve 682. Therefore, the substrate processing apparatus 1 can control the pressure in each hole 26 on the back surface side of the substrate W to the appropriate lifting pressure.

Specifically, the controller 90 regulates the lifting pressure in each hole 26 (pin housing chamber 63*a* and cylindrical hole 651) such that the lifting pressure in each hole 26 is slightly higher than the pressure in the processing space S that is above the mounting surface 25.

Figure 9:
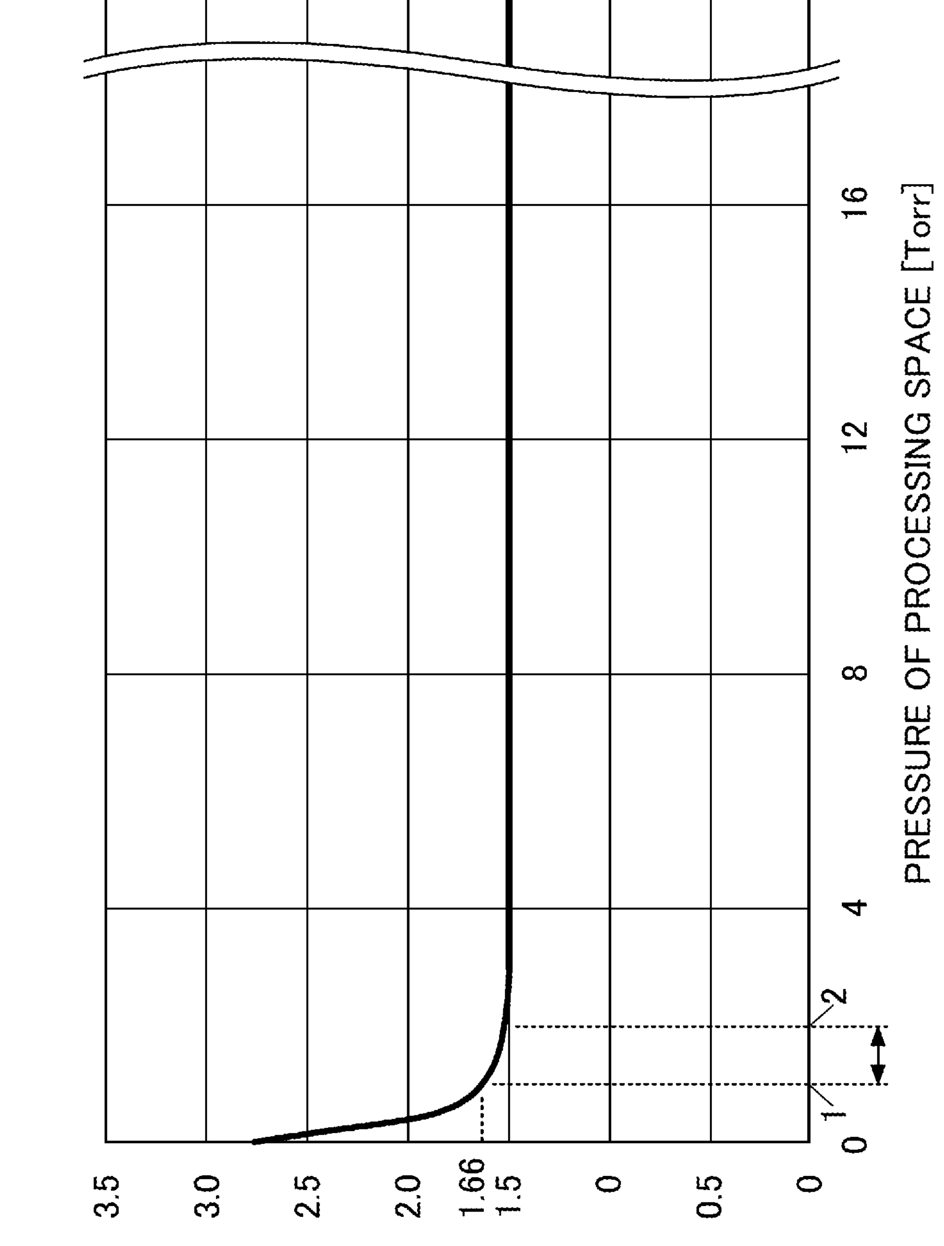
FIG. 9 is a graph illustrating the ratio of the pressure in each hole on a back surface side of the substrate to the pressure in a processing space.

For example, as illustrated in FIG. 9, in the substrate processing apparatus 1, the pressure in the processing space S is adjusted to a pressure in a range of 1 Torr to 100 Torr (=133 Pa to 13,332 Pa) by the gas supply 30 or by the gas exhaust 40 when substrate processing is performed. More preferably, the substrate processing apparatus 1 may set the pressure in the processing space S during substrate W transfer to be in a range of 1 Torr or more and less than 2 Torr (=267 Pa) in accordance with the pressure during film deposition processing.

In a case where the pressure in the processing space S at the time of transferring the substrate W is set to 1 Torr or more and less than 2 Torr as described above, it is preferable for the controller 90 to set the pressure in each hole 26 to 1.0 times or more and 1.66 times or less the pressure in the processing space S, i.e., set the range of the ratio of the pressure in each hole 26 to the pressure in the processing space S to 1:1 to 1.66:1. That is, the pressure at each hole 26 is to be set to 1 Torr or more and 3.32 Torr or less (=133 Pa or more and 443 Pa or less). For example, in a case where the pressure in the processing space S is 1.8 Torr, the gas supply 67 and the gas exhaust 68 are controlled such that the pressure in each hole 26 is 3 Torr (=400 Pa). By doing so, a minutely positive pressure can be applied to the substrate W without the substrate W being lifted up from the mounting surface 25.

As can be seen from the above ranges, the lifting pressure may be set to a pressure that is the same as the pressure in the processing space S. Even when the lifting pressure and the pressure in the processing space S are the same as described above, the substrate W can be lifted easily as each lift pin 61 rises because the gas on the processing space S side does not get applied to the substrate W. In addition, as illustrated in FIG. 9, in a case where the pressure in the processing space S when transferring substrate W is adjusted to a value lower than 1 Torr, the pressure in each hole 26 may be adjusted a pressure that is greater than 1.66 times the pressure in the processing space S. The range at this time is set to, for example, 2.8 times or less. This is because in a case where the pressure in the processing space S is small, the pressure applied to each hole 26 is sufficiently small to prevent the substrate W from lifting in the first place due to the weight of the substrate W. Conversely, when the pressure in the processing space S during the transferring of the substrate W is adjusted to a value of 2 Torr or more based on the pressure in the substrate processing, the pressure in each hole 26 is adjusted to 1.0 times or more and 1.5 times or less the pressure in the processing space S. Collectively, the overall range of the lifting pressure is 1.0 times or more and 2.8 times or less the pressure in the processing space S. However, range is preferably set at 1.0 times or more and 1.66 times or less in a case where the pressure in the processing space S is 1 Torr or more and less than 2 Torr, and preferably set to 1.0 times or more and 1.5 times or less in a case where the pressure in the processing space S is 2 Torr or more.

As described above, by regulating the pressure of each hole 26 to a lifting pressure that is greater than or equal to the pressure in the processing space S and at which the substrate W remains continuously mounted on the mounting surface 25, the substrate processing apparatus 1 can ready the substrate W in a state in which the substrate W can be easily separated from the mounting surface 25. That is, when the pressure in each hole 26 is lower than the pressure in the processing space S, the mounting surface 25 and the back surface of the substrate W stick together, thereby causing the air flow to become turbulent during lifting by each lift pin 61. Consequently, the particles generated during film deposition processing are liable to fly up. However, by setting each hole 26 to a minutely positive pressure that is slightly higher than the pressure in the processing space S, flying up of particles can be substantially prevented. In addition, since the substrate W on the mounting surface 25 can be made to remain continuously mounted even when the lifting pressure is applied to each hole 26, the inconvenience of, for example, the substrate W coming into contact with the recess 24 caused by the lifting of the substrate W can be circumvented.

The controller 90 may detect the pressure in the processing space S by a processing space-side pressure sensor 19 indicated by the dashed line in FIG. 1 and may regulate the amount of inert gas supplied or exhausted, based on both the value of the pressure in the processing space S and the pressure value of the pressure sensor 674 of the gas supply 67. Thus, the controller 90 can accurately control the lifting pressure in each hole 26 such that the lifting pressure in each hole 26 is a minutely positive pressure that is higher than the pressure in the processing space S.

Figure 7C:
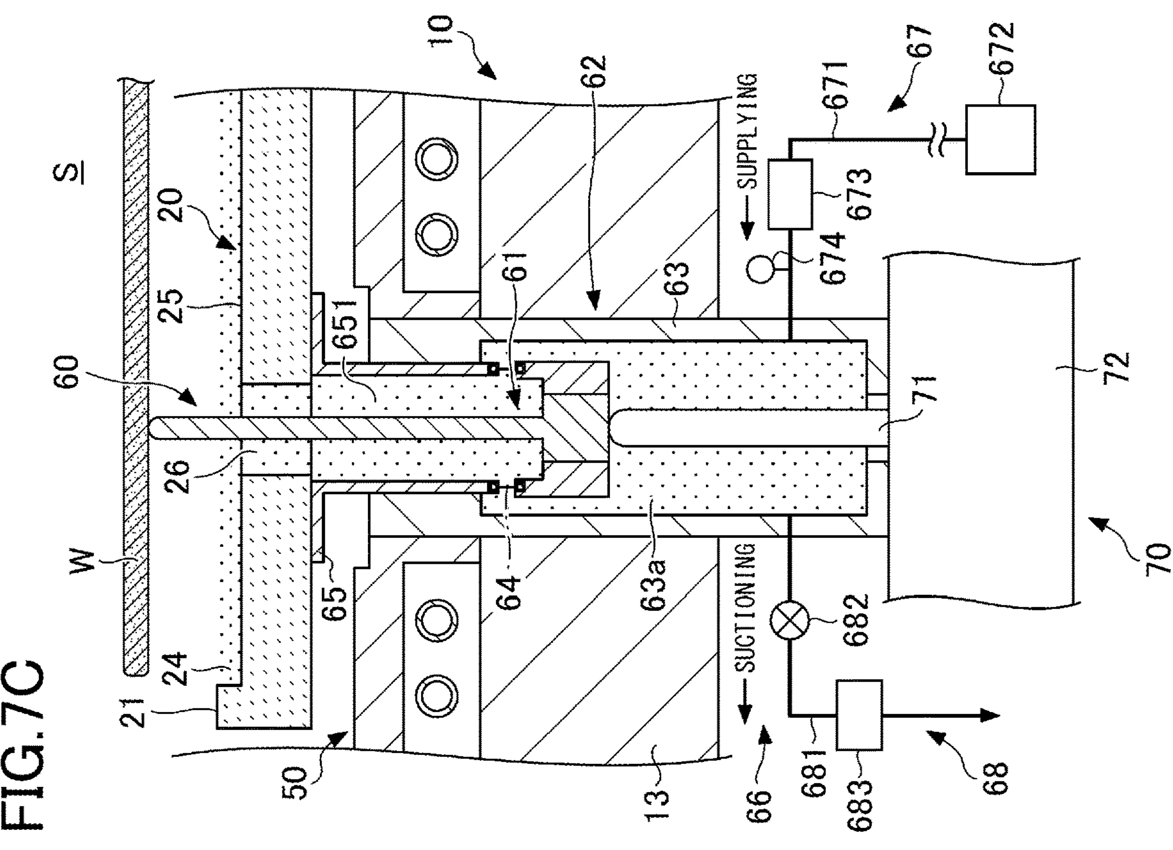
Figure 7B:
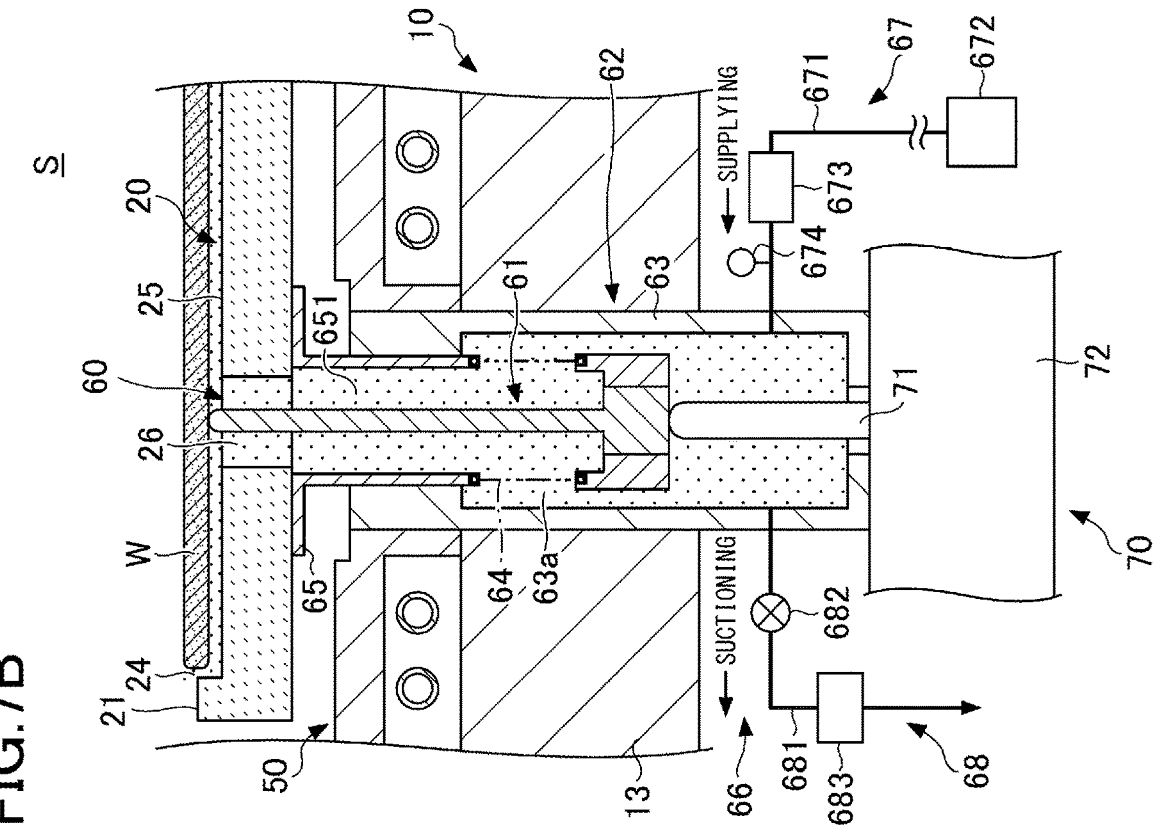

The controller 90 causes the substrate W to be lifted up from the mounting surface 25 by raising each lift pin 61 under the operation of the lower operating portion 70 in a state where each hole 26 is adjusted to the lifting pressure (step S5 in FIG. 5). Thus, as illustrated in FIG. 7B, the substrate W is held up in a lifted state by each of the lift pins 61 of the lift-pin mechanism 60.

At this time, since the lifting pressure in each hole 26 is a minutely positive pressure that is slightly higher than that of the processing space S, a situation where the substrate W is in tight contact with the mounting surface 25 can be circumvented, and thus the substrate W can be smoothly separated from the mounting surface 25. Even when the inert gas flows out from each hole 26 into the processing space S due to the lifting up of the substrate W, the flow is slow, and thus particles are substantially prevented from flying up into the processing space S.

The controller 90 operates the lower operating portion 70 to continue the raising of each lift pin 61 and the raising of the substrate W to the raised position HP where the transfer arm CA can receive the substrate W (step S6 in FIG. 5). As illustrated in FIG. 7C, while each lift pin 61 is being raised, the controller 90 continues to supply inert gas by the gas supply 67 and to exhaust gas by the gas exhaust 68. This prevents residual reactant gas from entering the upper lifting portions 62 during film deposition processing.

Figure 8B:
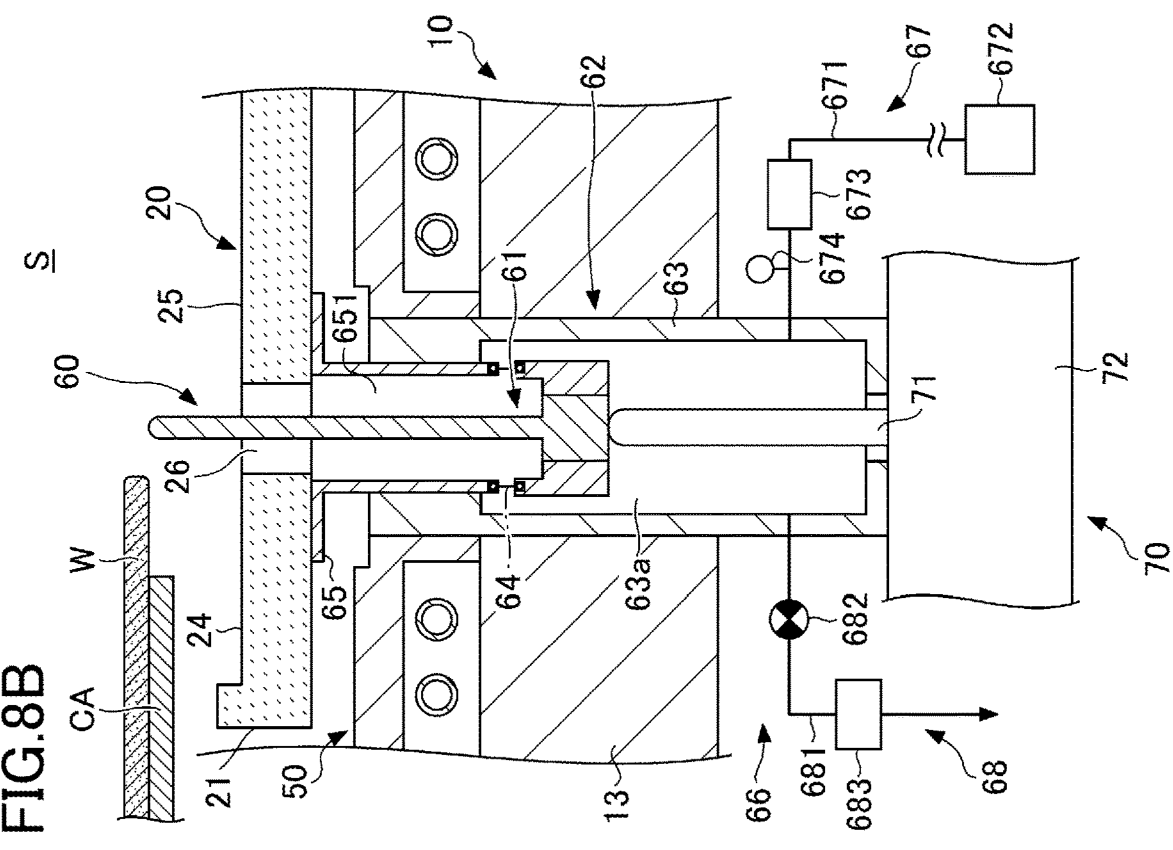
FIG. 8A to FIG. 8B are schematic cross-sectional views illustrating the operation of the lift-pin mechanism following FIG. 7, with FIG. 8A illustrating a seventh state and FIG. 8B illustrating an eighth state.
Figure 8A:
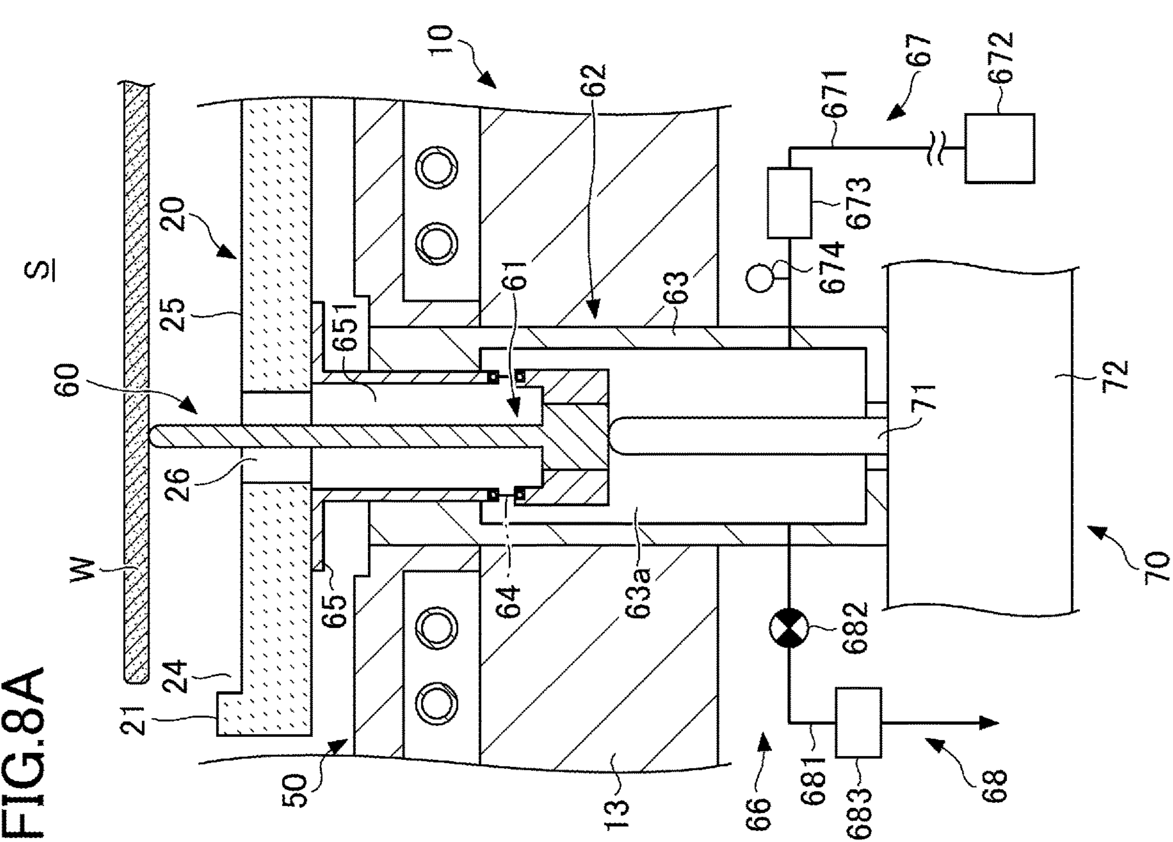

Upon the substrate W reaching the raised position HP, the controller 90 stops the supply of inert gas in the gas supply 67 and stops the exhaust of gas by the gas exhaust 68 (step S7 in FIG. 5). As illustrated in FIG. 8A, when the substrate W is in the raised position HP, each hole 26 is sufficiently open to the processing space S. Therefore, the substrate processing apparatus 1 can equalize the upper and lower pressures at an early stage on both sides of the rotary table 21 by stopping the flow of inert gas.

In this state, the controller 90 causes the substrate W to be passed to the transfer arm CA by advancing the transfer arm CA to the underside of the substrate W at the raised position HP and lowering each of the lift pins 61 (step S8 in FIG. 5). At this time, as illustrated in FIG. 8B, since the pressure in each hole 26 and the pressure in the processing space S are the same, the airflow does not affect the substrate W, and thus the substrate W can be stably passed to the transfer arm CA. Once the transfer arm CA receives the substrate W, the transfer arm CA then carries the substrate W out of the processing vessel 10.

As described above, in the substrate removal method, the substrate processing apparatus 1 can substantially prevent adhesion of particles to the substrate W by setting the pressure in each hole 26 below the mounting surface 25, on which the substrate W is mounted, to a lifting pressure that is higher than that of the processing space S and at which the substrate W does not get lifted.

Example of Substrate Removal Method

The substrate removal method was carried out by using the substrate processing apparatus 1 described above, and experiments were conducted to confirm as to whether or not particles actually adhered to the substrate W. In the experiment, multiple substrates W were prepared and divided into two groups: one group for which the substrate removal method described above was performed, and the other group for which the substrate W was merely lifted by the lift pins 61 without performing the substrate removal method for the sake of comparison, and confirmation was made as to whether or not particles adhered to the peripheral edge of the substrates W.

The same experiment was performed on a total of 23 substrates W as a group in which the substrates W were simply lifted by the lift pins 61. The results of the experiments reveal that particles adhered to the surfaces of seven substrates W. On average, the adhesion of particles occurred approximately 30% of the time. The same experiment was performed on a total of 21 substrates W as a set for which the substrate removal method described above was performed. The results of the experiments reveal that there were no particles on any of the substrates W (0% of substrates W had particles). That is, it can be seen that the substrate processing apparatus 1 and the substrate removal method according to the present embodiment greatly reduce the adhesion of particles.

The technical ideas and effects of the disclosure described in the above embodiment are described below.

The substrate processing apparatus 1 according to the first aspect of the present disclosure includes:

- the processing vessel 10 configured to accommodate the substrate W inside and to process the substrate W;
- the substrate support 20 that is provided inside the processing vessel 10 and has the mounting surface 25 on which the substrate W is mounted; and
- the lift-pin mechanism 60 that includes both the lift pin 61 that is movable relative to the substrate support 20 and the pin housing chamber 63*a* in which the lift pin 61 is housed, the lift-pin mechanism 60 being configured to lift the substrate W mounted in the substrate support 20 by raising the lift pin 61,
- wherein the substrate support 20 has the hole 26 through which the lift pin 61 is passable,
- wherein the lift-pin mechanism 60 further includes the pressure regulator 66 that regulates the pressure in the hole 26 by passing inert gas through the pin housing chamber 63*a*, and
- wherein at a timing when the substrate W is to be lifted, the pressure regulator 66 adjusts the pressure in the hole 26 to a lifting pressure that is greater than or equal to the pressure in the processing space S that is above the mounting surface 25 and at which the substrate W remains continuously mounted on the mounting surface 25.

As described above, the substrate processing apparatus 1 can easily separate the back surface side of the substrate W from the mounting surface 25 by adjusting the pressure in the hole 26 to a lifting pressure that is higher than the pressure in the processing space S and at which the substrate W continuously remains mounted on the mounting surface 25 by the pressure regulator 66. Therefore, the substrate processing apparatus 1 can smoothly lift the substrate W up from the mounting surface 25 by the lift pins 61, and can substantially prevent flying up of particles generated during substrate processing and reduce the adhesion of particles to the surface of the substrate W.

In addition, the lifting pressure is 1.0 times or more and to 2.8 times or less the pressure in the processing space S. Thus, the substrate processing apparatus 1 can stably keep the substrate W continuously mounted on the mounting surface 25 until the lift pins 61 come into contact with the substrate W, and smoothly lift the substrate W after the lift pins 61 come into contact with substrate W.

In addition, in the case where the pressure in the processing space S is 1 Torr or more and less than 2 Torr, the lifting pressure is 1.0 or more and 1.66 times or less the pressure in the processing space S. Thus, the substrate processing apparatus 1 can stably keep the substrate W continuously mounted on the mounting surface 25 even in the case where the pressure in the processing space S is 1 Torr or more and less than 2 Torr, and also smoothly lift the substrate W after the lift pins 61 come in contact with the substrate W.

Also, in the case where the pressure in the processing space S is 2 Torr or more, the lifting pressure is 1.0 or more and 1.5 times or less the pressure in the processing space S. Thus, the substrate processing apparatus 1 can appropriately regulate the pressure on the back surface side of the substrate W even when the pressure in the processing space S is set at 2 Torr or more in various times of substrate processing, and the substrate W can be easily separated from the mounting surface 25 when the lift pins 61 are raised, and thus particle adhesion can be substantially prevented.

Further, the pressure regulator 66 includes a gas supply channel 671 configured to supply inert gas to the pin housing chamber 63*a* and includes a gas supply regulator (mass flow controller 673) provided in the gas supply channel 671 to regulate the flow rate of the inert gas. Thus, the substrate processing apparatus 1 can smoothly regulate the pressure in the hole 26 by supplying inert gas to the pin housing chamber 63*a*.

The pressure regulator 66 also has a gas exhaust channel 681 that communicates with the pin housing chamber 63*a* and exhausts the gas that is in the pin housing chamber 63*a*, and has an exhaust regulator (a flow rate regulator valve 682) that regulates a degree to which a flow path in the gas exhaust channel 681 is opened. Thus, the substrate processing apparatus 1 can stably regulate the pressure in the hole 26.

The pressure regulator 66 also opens the exhaust regulator (flow rate regulator valve 682) before supplying inert gas to the pin housing chamber 63*a*. Thus, the substrate processing apparatus 1 can substantially prevent lifting of the substrate W due to the sudden increase in the pressure in the pin housing chamber 63*a* caused by the decrease in the pressure in the pin housing chamber 63*a* before the supply of the inert gas.

In addition, the pressure regulator 66 is equipped with a pressure sensor 674 configured to detect the pressure in the pin housing chamber 63*a*. The substrate processing apparatus further includes the controller 90 to control the operation of the lift-pin mechanism 60, based on a value of the pressure detected by the pressure sensor 674. Thus, the substrate processing apparatus 1 can accurately regulate the pressure in the hole 26.

In addition, the processing space-side pressure sensor 19 is provided to detect the pressure in the processing space S when the substrate W is raised. The controller 90 causes the pressure regulator 66 to regulate the pressure in the hole 26, based on the pressure value of the pressure sensor 674 and the pressure value of the processing space-side pressure sensor 19. Thus, the substrate processing apparatus 1 can appropriately adjust the pressure in the hole 26 according to the pressure value in the processing space S side.

In addition, the lift-pin mechanism 60 has the cylindrical member 65 peripheral to the lift pin 61 that can contact with the substrate support 20 as the lift pin 61 rises, and the pressure regulator 66 supplies inert gas to the pin housing chamber 63*a* before the cylindrical member 65 is brought into contact with the substrate support 20 at the timing when the substrate W is to be lifted. Thus, the substrate processing apparatus 1 can efficiently and stably regulate the pressure in the hole 26 by satisfactorily guiding the inert gas to the hole 26.

The pressure regulator 66 stops the supply of inert gas after the substrate W is separated from the substrate support 20 by the rise of the lift pin 61. Thus, the substrate processing apparatus 1 can substantially prevent adhesion of particles to the substrate W even more reliably.

The second aspect of the present disclosure is the substrate removal method of the substrate processing apparatus 1 for removing the substrate W from the substrate support 20 in which the substrate W is mounted, the substrate W being inside the processing vessel 10 that processes the substrate W, the substrate processing apparatus 1 including:

the lift-pin mechanism 60 that includes both the lift pin 61 that is movable relative to the substrate support 20 and the pin housing chamber 63*a* in which the lift pin 61 is housed, the substrate support 20 having both the mounting surface 25 on which the substrate W is mounted and the hole 26 through which the lift pin 61 is passable, the substrate removal method including:

adjusting the pressure in the hole 26 to a lifting pressure that is greater than or equal to a pressure in the processing space S that is above the mounting surface 25 and at which the substrate remains continuously mounted on the mounting surface 25, by passing inert gas, by the pressure regulator 66, through the pin housing chamber 63*a* at a timing when the substrate W is to be lifted; and causing the substrate W that is mounted in the substrate support 20 to be lifted by raising the lift pin 61. In the second aspect as well, the adhesion of particles to the surface of the substrate W can be reduced when removing the substrate W from the processing vessel 10.

Although the substrate processing apparatus 1 and substrate W removal method according to the embodiments disclosed herein should be considered to be exemplary in all respects and not restrictive. The above embodiments may be modified and enhanced in various forms without departing from the appended claims and spirit thereof. Matters described in the above embodiments may take on other configurations insofar as there are no contradictions, and may be combined insofar as there are no contradictions.

The substrate processing apparatus 1 in the present disclosure is applicable to any type selected from among atomic layer deposition (ALD) apparatus, a capacitively coupled plasma (CCP), an inductively coupled plasma (ICP), a radial line slot antenna (RLSA), an electron cyclotron resonance plasma (ECR), and a helicon wave plasma (HWP).

What is claimed is:

1. A substrate processing apparatus, comprising:

a processing vessel configured to accommodate a substrate inside and to process the substrate, the processing vessel having a bottom;

a substrate support that is provided inside the processing vessel and has a mounting surface on which the substrate is mounted;

a lift-pin mechanism that includes a lift pin movable relative to the substrate support, a cylindrical member disposed around the lift pin, and a pin housing chamber in which the lift pin is housed, the lift-pin mechanism being configured to lift the substrate mounted in the substrate support by raising the lift pin;

a case extending through the bottom of the processing vessel, the case including a protruding part that protrudes downward relative to the bottom of the processing vessel in a vertical direction, the pin housing chamber formed in the case; and circuitry configured to control supplying inert gas to the pin housing chamber, wherein the substrate support has a hole through which the lift pin is passable, wherein the cylindrical member includes a vertical part extending in the vertical direction and a flange part extending outward from the vertical part in a radial direction, the vertical part disposed inside the case, the flange part defining a top surface of the cylindrical member, wherein the flange part is configured to transition from a non-contact state with a lower surface of the substrate support to a contact state with the lower surface of the substrate support as the lift pin rises, wherein the lift-pin mechanism further includes a pressure regulator that regulates pressure in the hole by passing the inert gas through the pin housing chamber, wherein the circuitry is configured to adjust, at a timing when the substrate is to be lifted, the pressure in the hole to a lifting pressure that is greater than or equal to a pressure in a processing space that is above the mounting surface and at which the substrate remains continuously mounted on the mounting surface, wherein the pressure regulator includes a gas exhaust channel disposed in the protruding part of the case, the gas exhaust channel configured to exhaust gas in the pin housing chamber formed in the case, and wherein the circuitry is further configured to start supplying the inert gas to the pin housing chamber before the flange part reaches the contact state with the lower surface of the substrate support.

2. The substrate processing apparatus according to claim 1, wherein the circuitry is further configured to adjust the lifting pressure to be 1.0 times or more and 2.8 times or less relative to the pressure in the processing space.

3. The substrate processing apparatus according to claim 2, wherein the circuitry is further configured to adjust, in a case where the pressure in the processing space is 1 Torr or more and less than 2 Torr, the lifting pressure to be 1.0 times or more and 1.66 times or less relative to the pressure in the processing space.

4. The substrate processing apparatus according to claim 2, wherein the circuitry is further configured to adjust, in a case where the pressure in the processing space is 2 Torr or more, the lifting pressure to be 1.0 times or more and 1.5 times or less relative to the pressure in the processing space.

5. The substrate processing apparatus according to claim 1, wherein the pressure regulator includes both a gas supply channel configured to supply the inert gas to the pin housing chamber and a gas supply regulator provided in the gas supply channel, the gas supply regulator being configured to regulate a flow rate of the inert gas.

6. The substrate processing apparatus according to claim 1, wherein the pressure regulator further includes a gas exhaust regulator configured to regulate a degree to which a flow path in the gas exhaust channel is opened.

7. The substrate processing apparatus according to claim 6, wherein the pressure regulator opens the exhaust regulator before supplying the inert gas to the pin housing chamber.

8. The substrate processing apparatus according to claim 1, wherein the pressure regulator further includes a pressure sensor configured to detect a pressure of the pin housing chamber, and wherein the circuitry is further configured to control operation of the lift-pin mechanism based on a value of the pressure detected by the pressure sensor.

9. The substrate processing apparatus according to claim 8, further comprising a processing space-side pressure sensor configured to detect pressure of the processing space at a timing when the substrate is to be lifted, wherein the circuitry is further configured to adjust the pressure in the hole based on the value of the pressure detected by the pressure sensor and a value of the pressure detected by the processing space-side pressure sensor.

10. The substrate processing apparatus according to claim 1, wherein the circuitry is further configured to stop supplying the inert gas in response to the substrate being separated from the substrate support by the raising of the lift pin.

11. The substrate processing apparatus according to claim 1, wherein the lift pin includes a rod having a first diameter and a lower end base having a second diameter greater than the first diameter, and the gas exhaust channel is disposed to face the lower end base of the lift pin.

12. The substrate processing apparatus according to claim 1, wherein the lift pin includes a rod, a lower end base, and a seat member fixed to an outer peripheral surface of the lower end base, and a lower end of the vertical part of the cylindrical member is connected to an upper end of the seat member of the lift pin through a spring member.

* * * * *